United States Patent [19]

Kershaw

[11] 4,075,583

[45] Feb. 21, 1978

[54] LOW LOSS TUNEABLE FILTER

[75] Inventor: Joseph E. Kershaw, San Diego, Calif.

[73] Assignee: The United States of America as represented by the Secretary of the Navy, Washington, D.C.

[21] Appl. No.: 689,417

[22] Filed: May 24, 1976

[51] Int. Cl.² ............................................... H03H 7/10
[52] U.S. Cl. .................................. 333/73 R; 333/82 B; 334/45
[58] Field of Search ................. 333/73 R, 73 C, 82 R, 333/82 B, 70 S; 334/45, 78, 79, 81, 82

[56] References Cited

U.S. PATENT DOCUMENTS

| 2,272,062 | 2/1942 | George | 333/82 B X |
| 2,723,348 | 11/1955 | Dreyer, Jr. | 334/45 |
| 3,247,475 | 4/1966 | Buetow et al. | 334/82 X |

Primary Examiner—Paul L. Gensler
Attorney, Agent, or Firm—R. S. Sciascia; G. J. Rubens; T. M. Phillips

[57] ABSTRACT

A low loss tuneable RF filter including a parallel plate variable capacitor and a helical resonator within an extension of the resonator shield. The capacitor stator is supported on an insulator above one end of the helix while the rotor is mounted between the walls of the resonator shield. The rotor plates are wider than the stator plates by about 20%.

3 Claims, 3 Drawing Figures

LOW LOSS TUNEABLE FILTER

BACKGROUND OF THE INVENTION

The present invention relates to bandpass filters and more particularly to tuneable bandpass filters. In a ruggedized environment where space is at a premium such as that encountered in mobile and portable communications equipment used by the military, previously known tuneable filters utilized resonators and vacuum variable capacitors to tune the resonators which resulted in large size, low efficiencies and less resistance to damage in the ruggedized environment.

SUMMARY OF THE INVENTION

The present invention provides for a low loss tuneable RF filter consisting of a combined helical resonator and tuning capacitor combined in such a manner as to increase net circuit Q and reduce the physical size beyond any known or existing filters of this type. The resonantor coil has one end connected to the shield housing and the other end connected to the stationary plates of an air-dielectric variable capacitor mounted on a insulating member. The movable plates of the capacitor are attached to a metal movable shaft that is electrically connected to the shield housing. The rotor plates are wider than the stator plates by approximately 20% so that the fringe effect due to the stator plates contributes to total capacity and so that alignment during assembly in the plane parallel to the plates is not critical.

Accordingly, an object of the present invention is the provision of a low loss tuneable RF filter that incorporates a helix and tuning capacitor into a single integrated unit which results in a smaller volume, higher efficiency and improved performance under ruggedized environmental conditions.

Another object of the invention is the provision of a low loss tuneable RF filter which provides for a reduction over known tuneable filters in required volume 20-25% and an increase in efficiency by 8 to 10% in the unloaded net circuit Q.

Other objects and many of the attendant advantages of this invention will be readily appreciated as the same becomes better understood by reference to the following detailed description when considered in connection with the accompanying drawings.

DESCRIPTION OF THE PREFERRED EMBODIMENT

Figure 1:
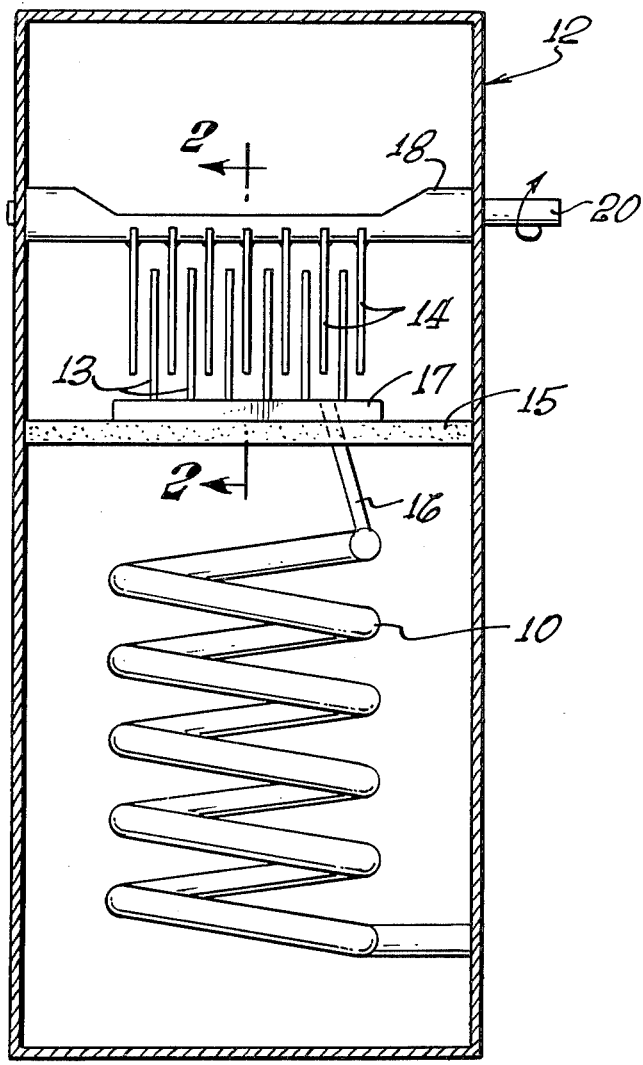
FIG. 1 is a longitudinal section through the filter.
Figure 2:
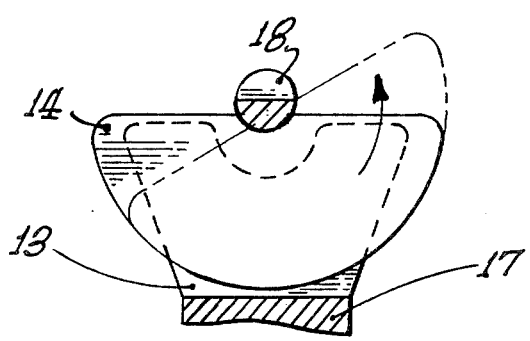
FIG. 2 is a sectional view taken along the lines 2—2 of FIG. 1.

Referring now to FIG. 1 wherein there is shown a helical coil 10 mounted in a resonator shield 12 which also functions as the filter case. The stator plates 13 of the tuning capacitor are mounted on a conducting plate 17 that is mounted on an insulating member 15.

The upper frequency of the tuning range, $f_h$, is higher than if a conventional parallel plate capacitor is used. The spacing between the rotor and stator plates, the number of plates, and the plate area determine the lower frequency of the tuning range, $f_1$. The stator plates 13 are connected to the helical coil 10 by means of a conducting strap 16. As shown the stator plates 13 are soldered in slots machined into a solid conducting plate 17 which is mounted on an insulating member (preferably Teflon). The rotor plates 14 are soldered into slots machined into the rotor 18. Rotor 18 is mounted between the walls of the shield 12 by means of a shaft member 20. In order to make good electrical contact between rotor 18 and shield 12 while permitting rotor 18 to rotate freely, a silver plated beryllium-copper spring washer is positioned between the interfacing surfaces of rotor 18 and shield 12.

The unique structure which integrates the capacitor and helical resonator within the resonator shield provides a very low inductance return and with the rotor plates 14 made approximately 20% wider than the stator plates 13, the fringe effect due to the stator plates contributes fully to total capacity and as a result the alignment durng assembly in the plane parallel to the plates is not critical.

Figure 3:
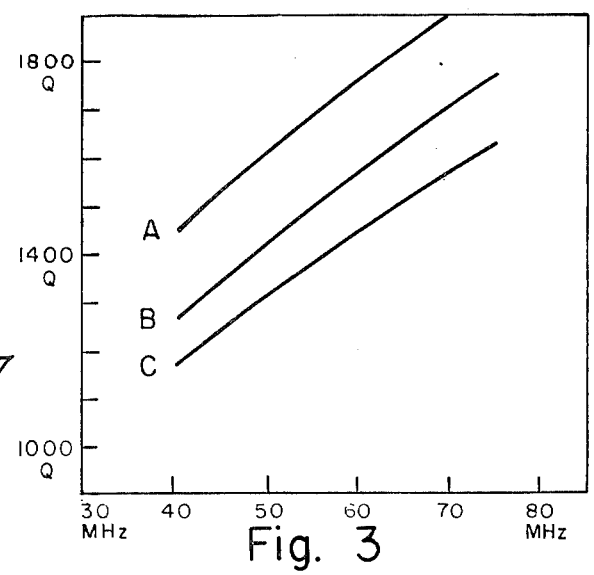
FIG. 3 is a graph showing increase of net circuit Q over the previously known best tuneable filter.

As shown in FIG. 3 the instant invention provides for about 9% improvement, in terms of net-circuit Q than the best vacuum varible capacitor available. Curve A represents the net circuit Q of the helical resonator if tuned by an ideal capacitor (zero-loss); Curve B represents the net circuit Q of the helical resonator constructed in accordance with the teaching of the instant invention; and curve C represents the net circuit Q using the best vaccum variable capacitor available.

In a specific embodiment built in accordance with the teaching of the invention, the following structure was found to function as expected.

A helix of 3¾ turns, silver plated, 4.30 inches high by 2.92 inches diameter, form of ⅛ inch OD copper tubing placed in a 3.82 inch square by 9⅝ inches long resonator shield.

A capacitor having rotor plates 1½ inch radius spaced ⅛ inch apart with stator plates 2.48 inch at the top tapering down to 1.4 inch at the base with ⅛ inch spacing between plates. Several rotor plates with 6 stator plates were used.

Obviously many modifications and variations of the present invention are possible in the light of the above teachings. It is therefore to be understood that within the scope of the appended claims the invention may be practiced otherwise than as specifically described.

What is claimed is:

1. A low loss tuneable RF filter capable of being continuously tuned over a frequency range of at least 2:1 comprising:
   a. an enclosed housing forming a shield,
   b. a helical coil resonator positioned in one end of said housing,
   c. a variable capacitor having a rotor and a stator positioned in the other end of said housing,
   d. one end of said helical coil being electrically connected to said housing at a point intermediate the end of said housing in which said variable capacitor is positioned and the end of said housing in which said helical is positioned, the other end of said helical coil being electrically connected to the stator of said variable capacitor,
   e. the rotor of said varible capacitor being mounted on a shaft supported by opposing walls of said housing and being electrically connected to said housing to provide optimum Q for said helical coil resonator, and
   f. said rotor and stator being dimensioned to provide said rotor with a uniform width that is wider than said stator and establishing a constant overlap as the rotor is rotated for tuning said filter over said frequency range.

2. The tuneable filter of claim 1 wherein the capacitor stator is supported on an insulator forming a partition between the portion of the housing wherein said coil is mounted and the portion of the housing wherein said capacitor is mounted.

3. The tuneable filter of claim 2 wherein the rotor plates are constantly approximately 20% wider than the stator plates of said capacitor as the rotor plates are moved from a meshed position to the unmeshed position.

* * * * *